United States Patent
Tsujimura (10) Patent No.: US 7,434,588 B2
(45) Date of Patent: Oct. 14, 2008

(54) SPIN CLEANING AND DRYING APPARATUS AND METHOD OF SPIN CLEANING AND DRYING

(75) Inventor: Shinichi Tsujimura, Mitaka (JP)

(73) Assignee: Tokyo Seimitsu Co., Ltd., Mitaka-shi, Tokyo (JP)

(*) Notice: Subject to any disclaimer, the term of this patent is extended or adjusted under 35 U.S.C. 154(b) by 0 days.

(21) Appl. No.: 11/206,997

(22) Filed: Aug. 19, 2005

(65) Prior Publication Data

US 2006/0042666 A1 Mar. 2, 2006

(30) Foreign Application Priority Data

Aug. 25, 2004 (JP) ............................. 2004-245053

(51) Int. Cl.
*B08B 3/00* (2006.01)

(52) U.S. Cl. .................. 134/102.3; 134/1.3; 134/95.2

(58) Field of Classification Search ............ 134/95.2, 134/137, 155, 182, 148, 157, 102.3
See application file for complete search history.

(56) References Cited

U.S. PATENT DOCUMENTS 4,393,807 A * 7/1983 Fujimura et al. ............ 118/501
5,965,200 A * 10/1999 Tateyama et al. ............ 427/240
6,793,769 B2 * 9/2004 Kajino et al. ............ 156/345.55
2004/0261817 A1 * 12/2004 Araki et al. .................... 134/2

FOREIGN PATENT DOCUMENTS

JP 11-330039 11/1999

* cited by examiner

*Primary Examiner*—Michael Barr
*Assistant Examiner*—Jason P Riggleman
(74) *Attorney, Agent, or Firm*—David S. Safran (57) ABSTRACT

The present invention provides a spin cleaning and drying apparatus of single-wafer processing type which cleans a substrate with a cleaning liquid from a rinse nozzle while rotating the substrate and dries the substrate after cleaning while rotating the substrate, comprising: a spin chuck which holds and rotates the substrates; a cup which has an opening on an upper side, a water discharge port and an exhaust gas port in a bottom portion, and encloses the spin chuck; a flow regulating plate which has a gas injection port in a middle and is provided so as to be able to move backward and forward to a position opposed to the substrate and spaced therefrom at a prescribed distance and to an upward or sideward retracted position; and an exhaust cover, having multiple slit holes each with a hood which opens to an upper surface, is provided below the spin chuck.

6 Claims, 9 Drawing Sheets

SPIN CLEANING AND DRYING APPARATUS
AND METHOD OF SPIN CLEANING AND
DRYING

BACKGROUND OF THE INVENTION

1. Field of the Invention

The present invention relates to a spin cleaning and drying apparatus and a spin cleaning and drying method and, more particularly, to a spin cleaning and drying apparatus which is installed in a CMP (chemical mechanical polishing) system and the like and performs the spin cleaning and drying of a substrate, such as a wafer, by single-wafer processing and a spin cleaning and drying method.

2. Description of the Related Art

In order to achieve miniaturization, semiconductor devices, electronic parts and the like are formed by being multilayer interconnected on a wafer (substrate) made of materials such as silicon. On that occasion, each time an interconnection of each layer is formed, planarization processing is performed and an interconnection of the next layer is formed on the flat surface.

In the planarization of a wafer (substrate), it has become a general practice to use a CMP (chemical mechanical polishing) system. A cleaning liquid is supplied while this wafer subjected to planarization process is being spun on a spin cleaning and drying apparatus provided in the CMP system, and finally pure water is supplied, whereby the cleaning step is completed. Furthermore, the drying step in which the pure water is discharged to the outside by spinning is carried out.

However, water drops remain in the center part of the wafer by drying which is carried out only by spinning and hence drying is insufficient also in parts other than the center part, with the result that water marks are formed in these parts. If water marks are formed, the quality of fine interconnection layers formed on the wafer deteriorates and particles occur.

In order to solve these problems in the wafer drying step, there have been proposed spin cleaning and drying apparatus in which an atmosphere cutoff plate which cuts off the outside air in an upper opening of a cup enclosing a spin chuck of the spin cleaning and drying apparatus is provided near a wafer, and in which a pure water supply port and a gas injection port which injects a drying aid gas are provided in the center part of the atmosphere cutoff plate. (Refer to the Japanese Patent Application Laid Open No. 11-330039, for example.)

SUMMARY OF THE INVENTION

However, with the apparatus described in the Japanese Patent Application Laid Open No. 11-330039, because of the supply of pure water from the middle part of the atmosphere cutoff plate disposed near a wafer, water drops adhere to a surface of the atmosphere cutoff plate facing the wafer and the water drops fall on the wafer in the next drying step, thereby making it impossible to sufficiently dry the wafer surface.

Also, because the atmosphere cutoff plate is disposed near the wafer, the flow of gas generated by the rotation of the wafer becomes a turbulent flow at the peripheral part of the wafer, thereby posing the problem that the drying of the peripheral part of the wafer, in particular, the peripheral part of the back surface of the wafer becomes insufficient.

Furthermore, during cleaning and drying, the moisture discharged to the outside of the substrate collides against the inner surface of the cup and mist rises upward, thereby posing the problem that the moisture again adheres to the substrate.

The present invention has been made in view of these circumstances and has as its object the provision of a spin cleaning and drying apparatus which can sufficiently dry the whole area of a substrate in spin cleaning and spin drying of the wafer by single-wafer processing.

To achieve the above object, in the first aspect of the present invention, there is provided a spin cleaning and drying apparatus of single-wafer processing type which cleans a substrate by supplying a cleaning liquid from a rinse nozzle while rotating the substrate and dries the substrate after cleaning while rotating the substrate. This spin cleaning and drying apparatus includes: a spin chuck which holds and rotates the substrates; a cup enclosing the spin chuck which has an opening on an upper side thereof, and has a water discharge port and an exhaust gas port in a bottom portion thereof; a flow regulating plate which has a gas injection port in a middle portion thereof and is provided so as to be able to move backward and forward to a position opposed to the substrate held by the spin chuck and spaced therefrom at a prescribed distance and to an upward or sideward retracted position; and an exhaust cover, having multiple slit holes each with a hood which opens to an upper surface thereof, is provided below the spin chuck.

According to the first aspect of the present invention, the flow regulating plate retracts upward or sideward in the cleaning of the substrate and, therefore, water drops do not adhere to the surface of the flow regulating plate. For this reason, water drops do not fall on the substrate surface during the drying of the substrate. Furthermore, because during drying, the flow regulating plate is disposed in a position which is opposed to the substrate and spaced therefrom at a prescribed distance, the flow of the surrounding air by the rotation of the substrate is regulated and no turbulent flow occurs. Furthermore, a drying aid gas is supplied from the middle part. Accordingly, the whole area of the front and back surfaces of the substrate is sufficiently dried.

Also, because an exhaust cover having multiple slit holes each with a hood is provided below the spin chuck, the mist which is generated when the moisture discharged to the outside of the substrate during cleaning and drying collides against the inner surface of the cup is exhausted to outside the cup via the slit holes with hood and does not rises upward. Therefore, during cleaning and drying, the mist has no adverse effect on the wafer.

The feature of the second aspect of the present invention is that in the first aspect, the flow regulating plate is formed from an electrically conductive material. According to the second aspect, because the flow regulating plate is formed from an electrically conductive material, it is possible to discharge the static electricity generated by high-speed rotation of the substrate in dry air to the outside via the flow regulating plate.

In the third aspect of the present invention, there is provided a spin cleaning and drying apparatus of single-wafer processing type which cleans a substrate by supplying a cleaning liquid from a rinse nozzle while rotating the substrate and dries the substrate after cleaning while rotating the substrate. This spin cleaning and drying apparatus includes: a spin chuck which holds and rotates the substrates; a cup which has an opening on an upper side thereof, is provided with a water discharge port and an exhaust gas port in a bottom portion thereof, and encloses the spin chuck; a scan arm which has a gas injection port at a leading end thereof and traverses the substrate from a middle part to a peripheral part thereof; and an exhaust cover, having multiple slit holes each with a hood which opens to an upper surface thereof, is provided below the spin chuck.

According to the third aspect, because a scan arm which has a gas injection port at a leading end thereof traverses the substrate while injecting the drying aid gas from a middle part to a peripheral part thereof during the drying of the substrate, the whole area of the substrate is sufficiently dried.

Also, because an exhaust cover having multiple slit holes each with a hood is provided below the spin chuck, the mist which is generated when the moisture discharged to the outside of the substrate during cleaning and drying collides against the inner surface of the cup is exhausted to outside the cup via the slit holes with hood and does not rise upward. Therefore, during cleaning and drying, the mist has no adverse effect on the wafer.

The feature of the fourth aspect of the present invention is that in any one of the first to third aspects, the slit holes with hood are formed from the middle part of the exhaust cover to the peripheral part thereof and the hood is formed from one side of a long side of the slit hole to the other side thereof and opens on the other side.

According to the fourth aspect, the slit holes with hood of the exhaust cover are formed from the middle part of the exhaust cover to the peripheral part thereof and the hood is formed from one side of a long side of the slit hole to the other side thereof and opens on the other side. Therefore, it is possible to perform exhaust to outside the cup without causing the mist generated within the cup to rise upward.

In the fifth aspect of the present invention, there is provided a spin cleaning and drying method of single-wafer processing type which involves cleaning and drying a substrate while rotating the substrate, which includes: the step of supplying a cleaning liquid while rotating the substrate at a first rotational speed and cleaning the substrate; the step of disposing a flow regulating plate in a position permitting flow regulation so that no turbulent flow of the fluid occurs near a periphery of the substrate by the rotation of the substrate; the step of drying the substrate, which involves supplying a drying aid gas to the substrate and rotating the substrate by increasing the rotational speed by stages or continuously from a second rotational speed which is lower than the first rotational speed to a third speed which is higher than the first rotational speed.

According to the fifth aspect, rinse is performed by supplying a cleaning liquid while rotating the substrate at a first rotational speed, a flow regulating plate is then disposed so that no turbulent flow of the surrounding fluid occurs due to the rotation of the substrate, a drying aid gas is then supplied, and the substrate can be sufficiently dried by increasing the rotational speed from a second rotational speed which is lower than the first rotational speed to a third speed which is higher than the first rotational speed. Therefore, it is possible to sufficiently dry the substrate up to the peripheral part of the substrate by gradually drying the substrate from the center part of the substrate.

In the sixth aspect of the present invention, there is provided a spin cleaning and drying method of single-wafer processing type which involves cleaning and drying a substrate while rotating the substrate, which includes: the step of supplying a cleaning liquid while rotating the substrate and cleaning the substrate; and the step of drying, including injecting a drying aid gas onto the substrate while rotating the substrate and traversing an injection point from a center part to a peripheral part of the substrate.

According to the sixth aspect, because during rotation of the substrate an injection point of a drying aid gas is traversed from the center part of the substrate to the peripheral part of the substrate, the substrate can be sufficiently dried from the center part of the substrate to the peripheral part of the substrate.

The feature of the seventh aspect of the present invention is that in the sixth aspect, the traverse speed of the drying aid gas in the traverse of the injection point of the drying aid gas is lowered from the center of the substrate toward the peripheral part thereof. According to the seventh aspect, because the traversed speed is lowered toward the peripheral part where the area of the substrate surface increases, it is possible to sufficiently dry the whole area of the substrate.

The feature of the eighth aspect of the present invention is that in any one of the fifth to seventh aspects, the drying aid gas is dry air or nitrogen gas which is caused to pass through a filter. According to the eighth aspect, because normal dry air or nitrogen gas is used as the drying aid gas, it is possible to sufficiently dry the whole area of the substrate.

The feature of the ninth aspect of the present invention is that in any one of the fifth to eighth aspects, the drying aid gas is caused to contain ions and static electricity generated in the step of drying is discharged to the air.

According to the ninth aspect, because the drying aid gas is caused to contain ions and static electricity generated in the step of drying is discharged to the air, it is possible to prevent a semiconductor device and the like formed on the substrate from being electrostatically broken down.

As described above, with a spin cleaning and drying apparatus of the present invention, during the drying of the substrate water drops do not fall on the substrate, no turbulent flow due to the flow regulation of the flow of the surrounding air by the rotation of the substrate occurs, and the whole area of the substrate is sufficiently dried by the injection of a drying aid gas. Also, the exhaust cover prevents the mist generated within the cup from rising upward.

Also, with a spin cleaning and drying method of the present invention, it is possible to sufficiently dry the substrate by gradually drying the substrate from the center part of the substrate to the peripheral part of the substrate.

DETAILED DESCRIPTION OF THE PREFERRED EMBODIMENTS

Preferred embodiments of a spin cleaning and drying apparatus and a spin cleaning and drying method according to the present invention will be described below on the basis of the accompanying drawings. Incidentally, like reference numerals or characters refer to like members in each of the drawings.

Figure 1:
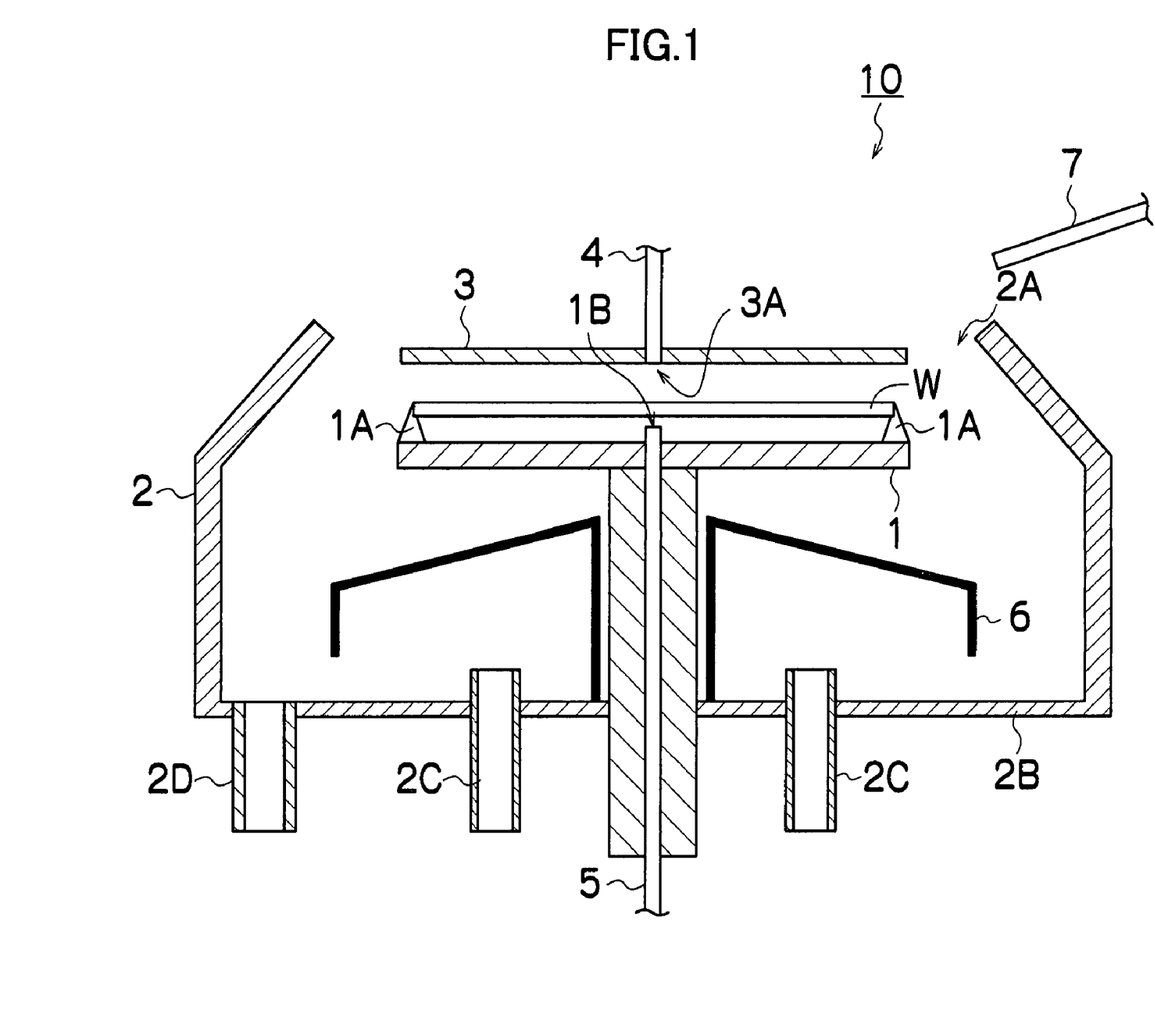
FIG. 1 is a sectional view of a spin cleaning and drying apparatus related to an embodiment of the present invention.

FIG. 1 is a sectional view of a spin cleaning and drying apparatus related to an embodiment of the present invention. The spin cleaning and drying apparatus 10 is constituted by a spin chuck 1 which has three supporting pins 1A, 1A, 1A, which support a wafer W on an upper surface, and spins, a cup 2 in an upper part of which an opening 2A is formed and which encloses the spin chuck 1, a flow regulating plate 3 which can move to a position opposed to the wafer W and spaced therefrom at a prescribed distance and to a position which is retracted upward, a rinse nozzle 7 which supplies a rinse liquid from the opening 2A of the cup 2 to the wafer W, an exhaust cover 6 which is provided below the spin chuck 1 within the cup 2, etc.

A gas injection port 1B is formed in the center of the spin chuck 1, and this gas injection port 1B is connected to a nitrogen gas source by a pipe 5 so that the gas injection port 1B injects nitrogen gas as a drying aid gas to the back surface of the wafer W.

The flow regulating plate 3, which is an electrically conductive metallic disk having a diameter larger than the diameter of the wafer W, is effective in regulating the flow of gas generated by the rotation of the wafer W so that the flow does not become a turbulent flow near the peripheral edge of the wafer W when the flow regulating plate 3 is disposed opposite to the wafer W at a prescribed distance therefrom.

Also in the center of this flow regulating plate 3, a gas injection port 3A is formed and this gas injection port 3A is connected to the nitrogen gas source by a pipe 4 so that the gas injection port 3A injects nitrogen gas as a drying aid gas to the front surface of the wafer W.

The flow regulating plate 3 is so constructed as to be able to be retracted upward greatly and when a rinse liquid is supplied from the rinse nozzle 7 to the wafer W, the flow regulating plate 3 is positioned in this upward retracted position. Incidentally, the retracted position of the flow regulating plate 3 is not limited to this upward position above the wafer W, and the flow regulating plate 3 may be so constructed as to be able to be retracted sideward from the wafer W.

A water discharge port 2D is provided in a bottom part 2B of the cup 2 which encloses the spin chuck 1 and this water discharge port 2D discharges a rinse liquid to outside the cup 2. Also, in a bottom part 2B of the cup 2, three exhaust gas ports 2C are provided in positions which are divided into three on a circumference with respect to the center. These three exhaust gas ports 2C, 2C, 2C are each connected to a forced exhaust system (not shown), which sucks the gas and a mist-like rinse liquid in the cup 2 and discharges them to outside the cup 2.

Figure 2:
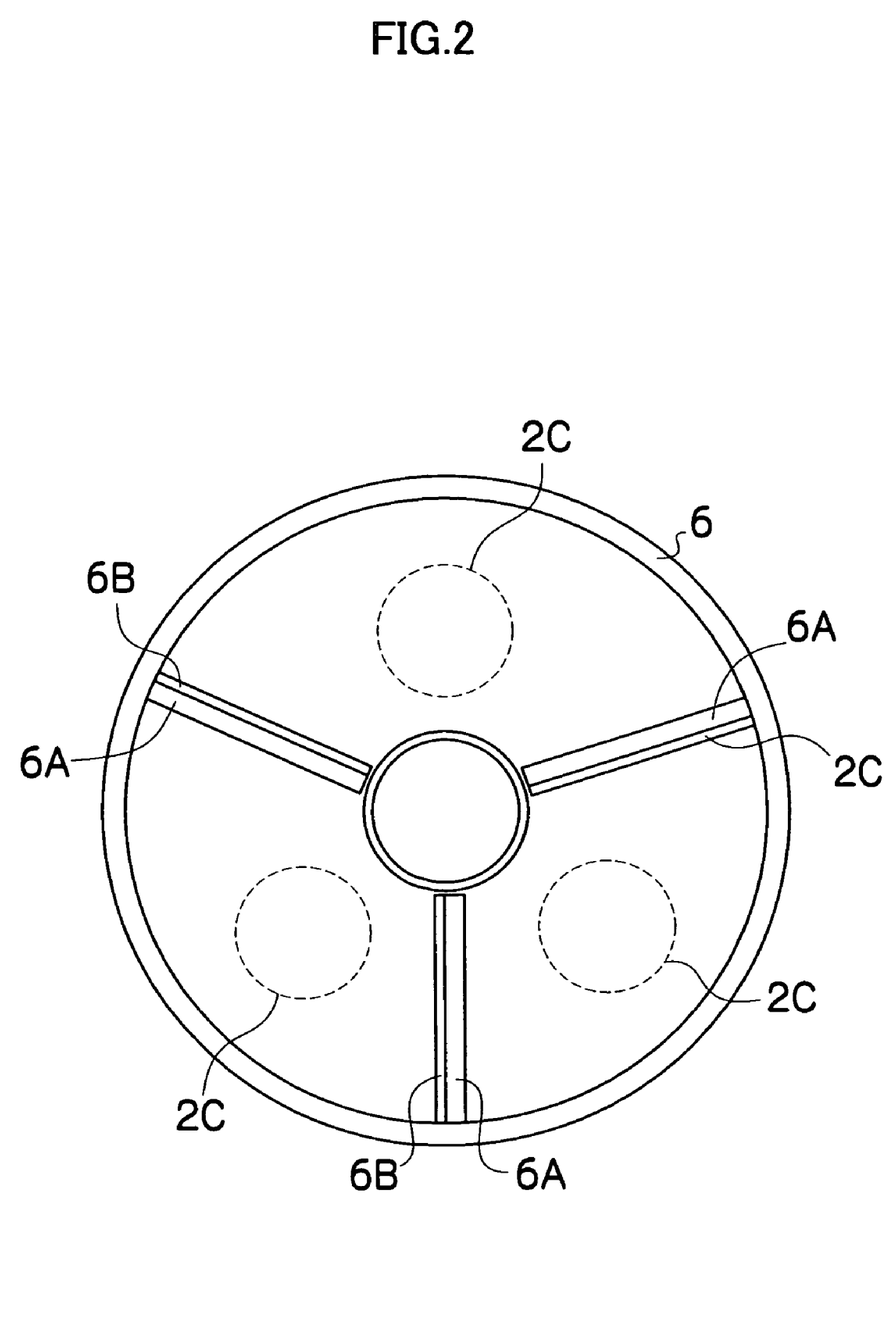
FIG. 2 is a plan view of an exhaust cover.

The exhaust cover 6 provided below the spin chuck 1 of the cup 2 is a cylindrical cover which encloses a rotary shaft portion of the spin chuck 1 and has an upper surface which is inclined toward the periphery. FIG. 2 is a plan view of this exhaust cover 6 and FIG. 3 is an enlarged sectional view of the exhaust cover 6.

As shown in FIG. 2, on the upper surface of the exhaust cover 6 which is inclined toward the periphery, there are provided three slit holes 6A which are formed from the center part toward the periphery in positions which are divided into three on a circumference, the slit holes 6A being rectangular holes each having a hood. As shown in FIG. 3, the slit holes with hood have each a hood 6B which covers the rectangular hole from one side of the rectangular hole and opens on the other side.

The exhaust cover 6 is disposed in such a manner that each of the slit holes 6A with hood is positioned at the midpoint between the exhaust gas ports 2C, 2C, 2C provided in the bottom part 2B of the cup 2 as viewed in a planar manner, and the opening of the hood 6B of the slit hole with hood 6A opens in a direction opposed to the rotation direction of the spin chuck 1.

Figure 3:
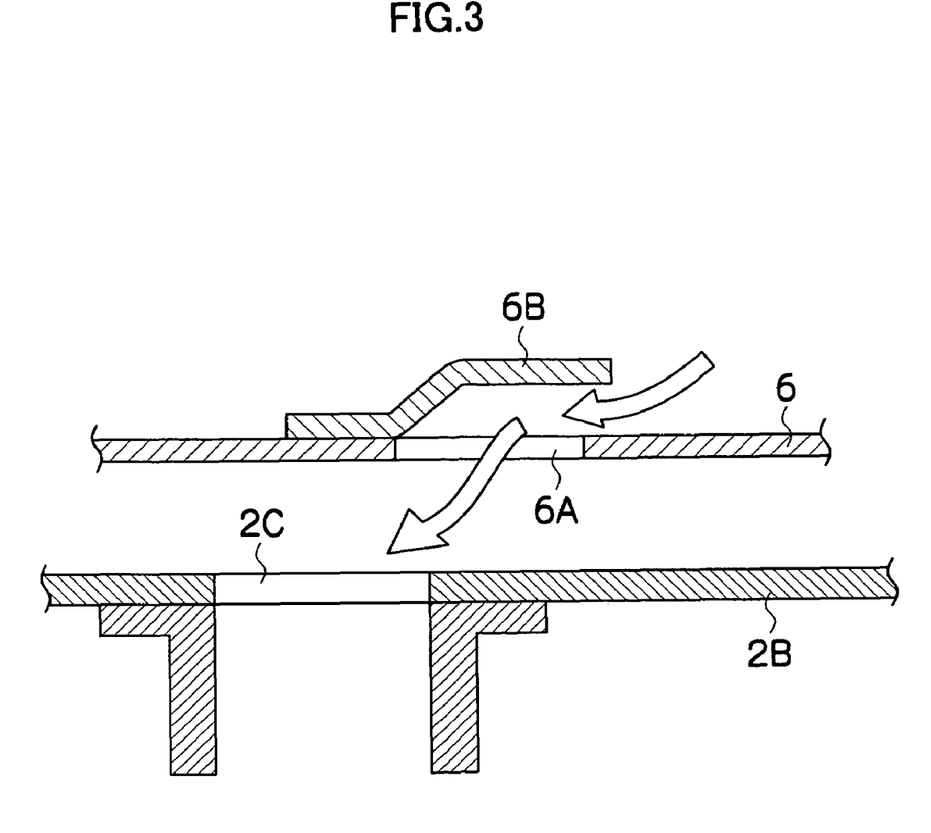
FIG. 3 is a partial enlarged view of the exhaust cover.

Because the slit holes with hood 6A of the exhaust cover 6 are formed in this manner, the mist generated within the cup 2 does not rise upward within the cup 2 and as indicated by the white arrows of FIG. 3, the mist is sucked by the exhaust gas port 2C and discharged outside the cup 2 with good efficiency.

Figure 4:
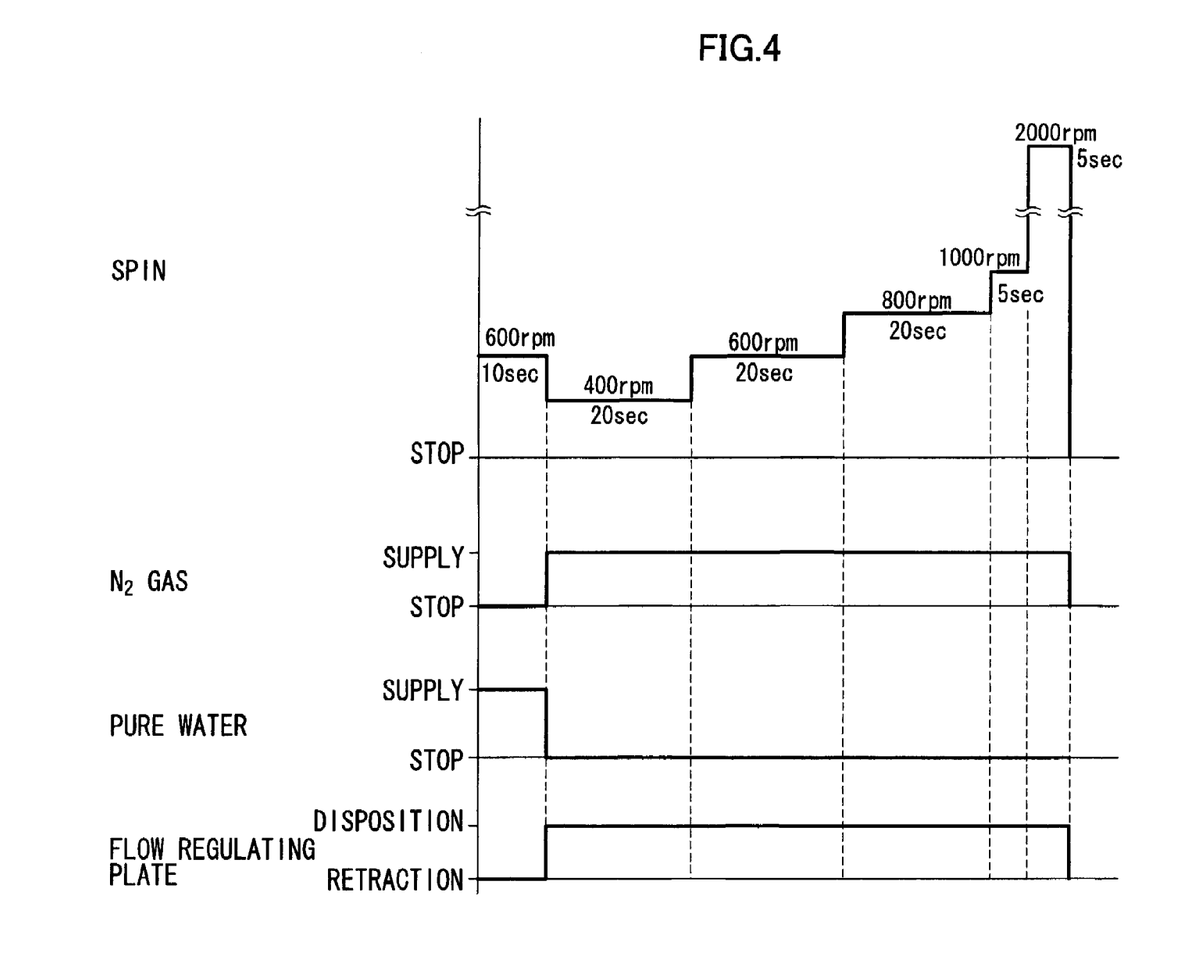
FIG. 4 is a time chart to explain a spin cleaning and drying method related to an embodiment of the present invention.
Figure 5:
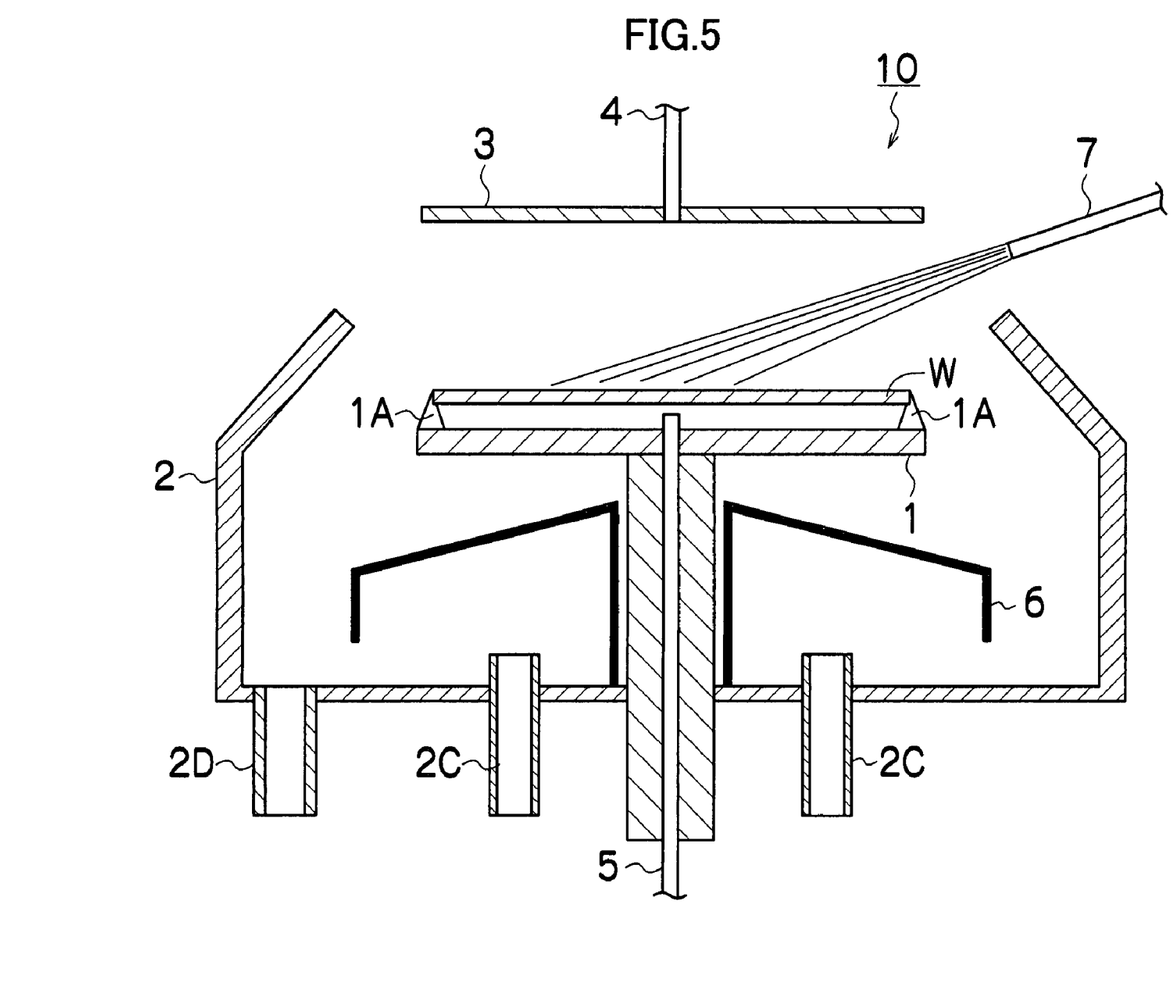
FIG. 5 is a sectional view to explain the step of cleaning.

Next, a description will be given of a spin cleaning and drying method which is carried out by use of a spin cleaning and drying apparatus of such a construction as described above. FIG. 4 is a time chart to show an embodiment of this spin cleaning and drying method. First, as shown in FIG. 5, the flow regulating plate 3 is retracted beforehand to the upper retracted position and a wafer W having a diameter of 200 mm is supported at three points by the supporting pins 1A, 1A, 1A of the spin chuck 1.

Next, as shown in FIG. 4, pure water is supplied from the rinse nozzle 7 to the wafer W for 10 seconds while the spin chuck 1 is rotated at a rotational speed of 600 rpm and the front surface of the wafer W is cleaned (the step of cleaning). Although mist is generated within the cup 2, the mist is efficiently sucked from the slit holes with hood 6A, 6A, 6A of the exhaust cover 6 and discharged outside the cup 2 from the exhaust gas port 2C, 2C, 2C, with the result that the mist does not rise toward the wafer W.

Next, the supply of pure water is stopped, and as shown in FIG. 1, the flow regulating plate 3 is spaced 5 mm or so from the upper surface of the wafer W and disposed opposite to the wafer W. Subsequently, nitrogen gas as a drying aid gas is injected at the wafer W from the gas injection port 3A provided in the center part of the flow regulating plate 3 and the gas injection port 1B provided in the center part of the spin chuck 1. The injection volume is about 15 l/min.

In this condition, as shown in FIG. 4, the spin chuck 1 is rotated for 20 seconds at a rotational speed of 400 rpm, and subsequently, the rotational speed of the spin chuck 1 is increased to 600 rpm for 20 seconds, then to 800 rpm for 20 seconds, then to 1,000 rpm for 5 seconds, and then to 2,000 rpm for 5 seconds (the step of drying).

In this manner, in the step drying, the wafer W is first gradually dried from the center part by low-speed rotation and subsequently procedures which involve rotating the wafer W at medium and high speeds are followed, whereby both of the front and back surfaces of the wafer W can be sufficiently dried without the formation of water marks on the front surface.

Figure 6:
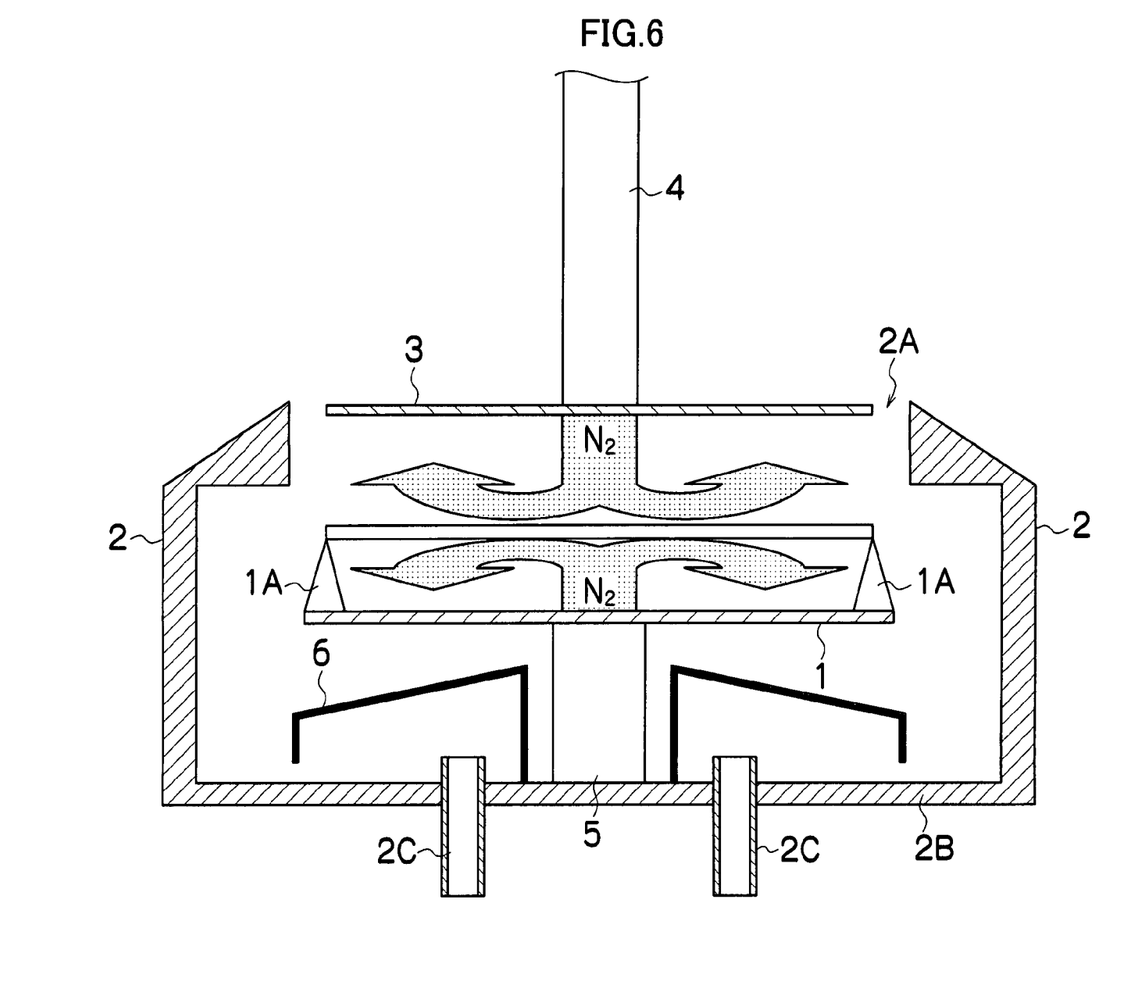
FIG. 6 is a conceptual diagram to explain the step of drying.

FIG. 6 conceptually shows the condition of this drying step. Although in general a turbulent flow is generated in the gas around the wafer W due to the rotation of the wafer W, in the case of the present invention the flow regulating plate 3 regulates the flow of the gas and, therefore, a turbulent flow generated near the wafer W is suppressed. Also, because the flow regulating plate 3 is an electrically conductive metallic plate, the static electricity generated by the friction between the wafer W and the drying aid gas due to the high-speed rotation of the wafer W is discharged outside the cup 2, thereby preventing a semiconductor device and the like formed on the wafer W from being electrostatically broken down.

Incidentally, although the rotational speed of the spin chuck 1 was changed by stages from a low speed to a high speed, the rotational speed may be continuously changed. The rotational speed and time of the spin chuck 1 and the injection volume of nitrogen gas in the above-described procedures are appropriately changed depending on the diameter of the wafer W.

Although nitrogen gas was used as a drying aid gas, dry air which is passed through a high-performance filter, such as a ULPA filter (ultra low penetration air filter) may also be used. Furthermore, it is more preferred that ions be caused to be contained in a drying aid gas by an ionizer and that static electricity be discharged into the air.

Figure 7:
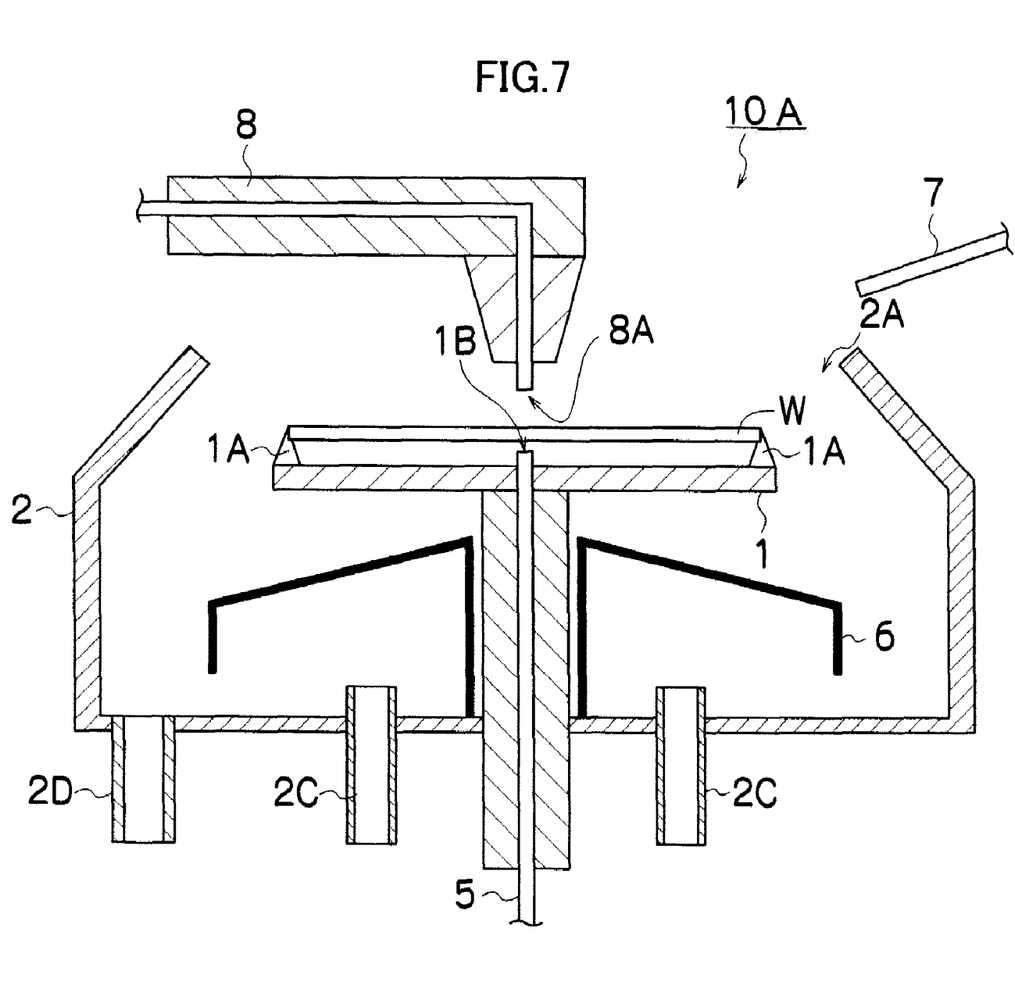
FIG. 7 is a sectional view of a spin cleaning and drying apparatus related to another embodiment of the present invention.

Next, a description will be given of a spin cleaning and drying apparatus related to another embodiment of the present invention. Compared to the above-described spin cleaning and drying apparatus 10, this spin cleaning and drying apparatus 10A of another embodiment does not have the flow regulating plate 3 and is provided with a scan arm 8 at a leading end of which a gas injection port 8A is formed and which traverses the wafer W from the center part of the wafer W beyond the peripheral part thereof by being driven by a drive device, which is not shown. A further description of this spin cleaning and drying apparatus 10A is omitted because other constitutional features are the same as with the above-described spin cleaning and drying apparatus 10.

The scan action of the scan arm 8 is performed by a gyrating method of a simple structure and the gyrating speed is controlled according to the gyrating angle. Incidentally, this scan action by the scan arm 8 is not limited to the gyrating method and a well-known straight-line driving method may be used.

Figure 8:
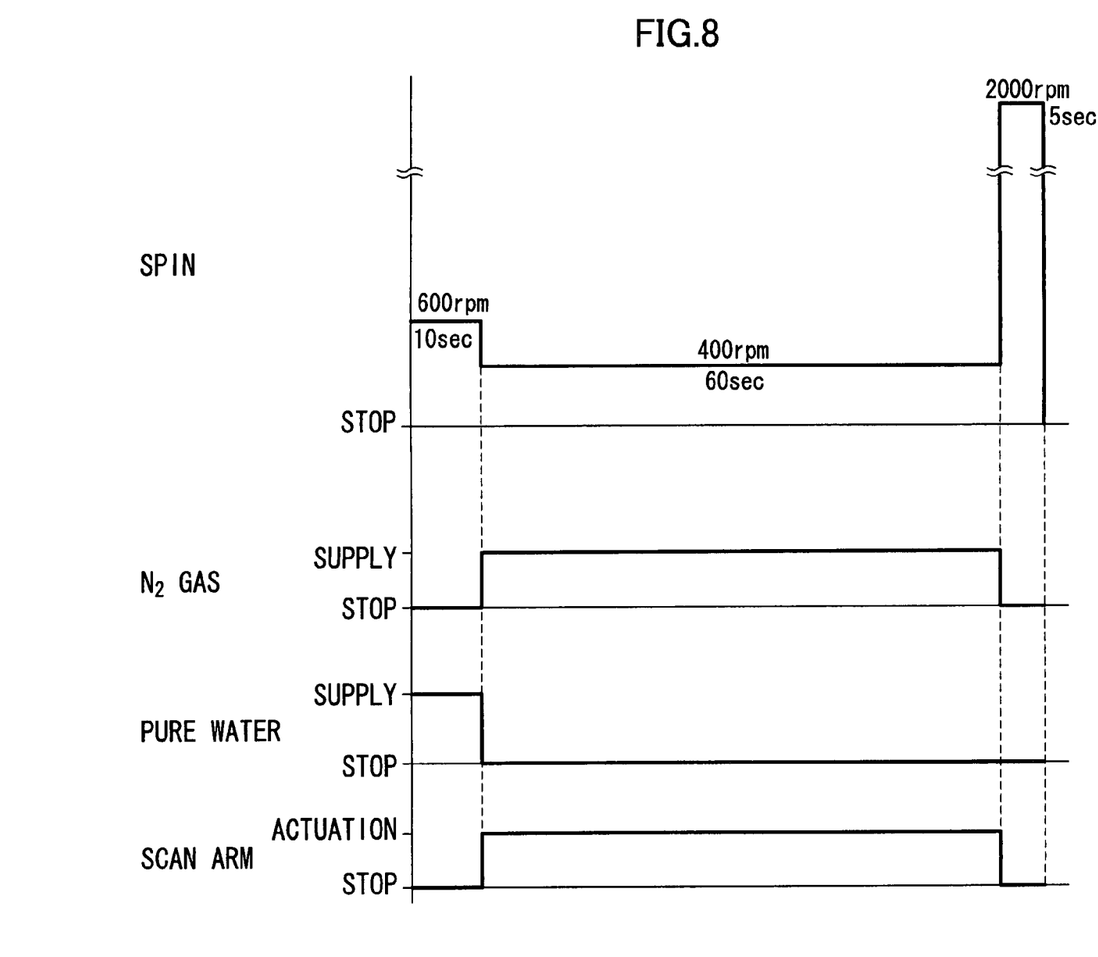
FIG. 8 is a time chart to explain a spin cleaning and drying method related to another embodiment of the present invention.
Figure 9:
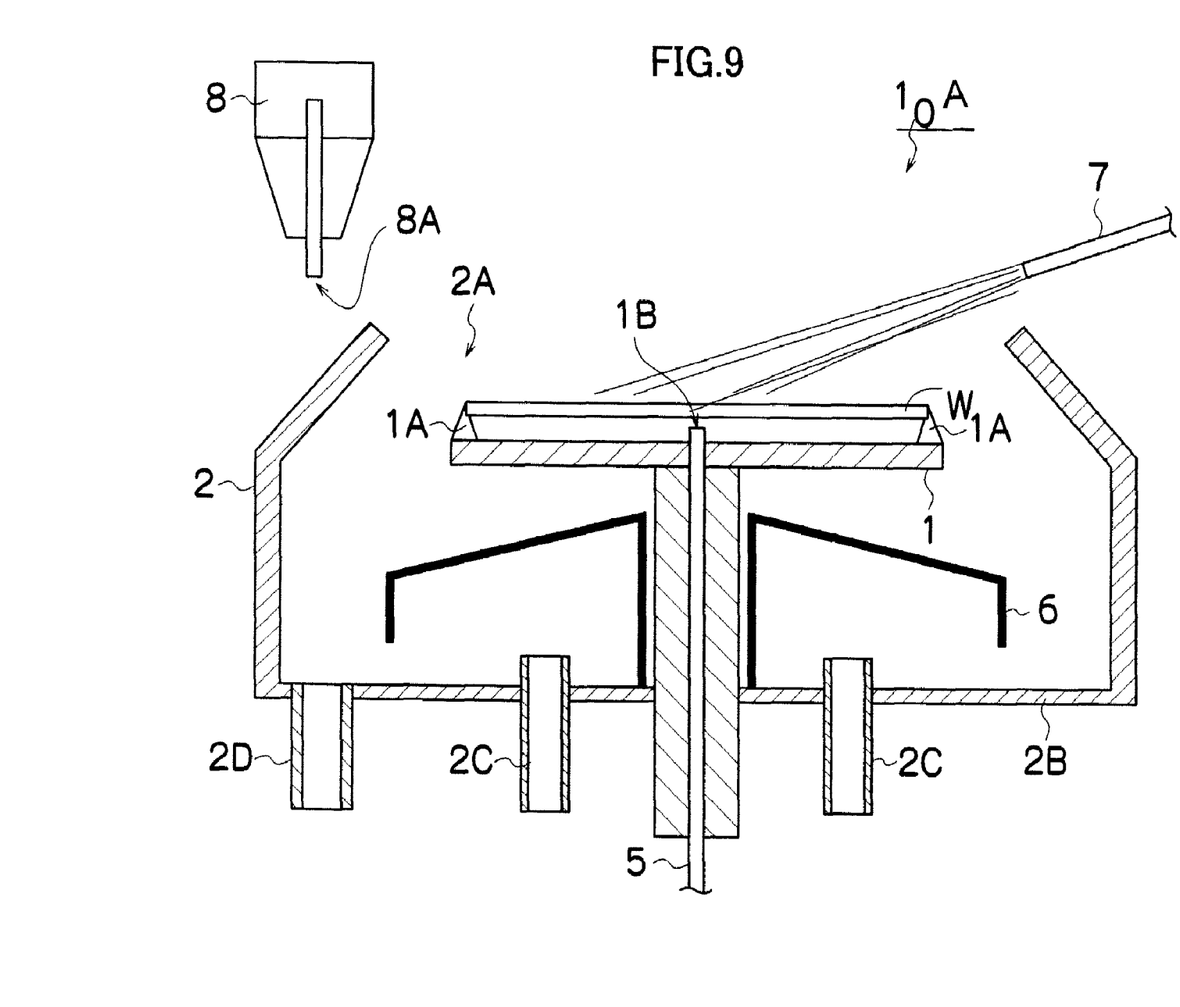
FIG. 9 is a sectional view to explain the step of cleaning of another embodiment.

FIG. 8 is a time chart which shows an embodiment of a spin cleaning and drying method using this spin cleaning and drying apparatus 10A. First, as shown in FIG. 9, the scan arm 8 is retracted beforehand to the retracted position outside the cup 8 and a wafer W having a diameter of 200 mm is supported at three points by the supporting pins 1A, 1A, 1A of the spin chuck 1.

Next, as shown in FIG. 8, pure water is supplied from the rinse nozzle 7 to the wafer W for 10 seconds while the spin chuck 1 is rotated at a rotational speed of 600 rpm and the front surface of the wafer W is cleaned (the step of cleaning). Although mist is generated within the cup 2, the mist is efficiently sucked from the slit holes with hood 6A, 6A, 6A of the exhaust cover 6 and discharged outside the cup 2 from the exhaust gas ports 2C, 2C, 2C, with the result that the mist does not rise toward the wafer W.

Next, the supply of pure water is stopped and an injection port 8A at the leading end of the scan arm 8 is positioned above the center part of the wafer W. Subsequently as shown in FIG. 8, the spin chuck 1 is rotated at a rotational speed of 400 rpm and nitrogen gas as a drying aid gas is injected at the wafer W from the injection port 8A at the leading end of the scan arm 8 and the gas injection port 1B provided in the center part of the spin chuck 1. The injection volume is about 15 l/min. FIG. 7 shows this condition.

In this condition, as shown in FIG. 8, the injection point of nitrogen gas from the scan arm 8 is scanned for 60 seconds from the center part of the wafer W toward the peripheral part thereof. The moving speed of the scan arm 8 at that time is such that the scan arm 8 is moved fast in the center part of the wafer W and the nearer to the periphery of the wafer W, the lower the speed.

When the injection point of nitrogen gas has become offset from the periphery of the wafer W, the movement of the scan arm 8 is stopped and the injection of nitrogen gas is also stopped. Subsequently, the spin chuck 1 is rotated at a high speed of 2,000 rpm for five seconds, and with this, the operation of the spin cleaning and drying apparatus 10A is completed (the step of drying).

In this manner, nitrogen gas as a drying aid gas is injected onto a rotating wafer W and the injection point of nitrogen gas is scanned from the center part of the wafer W toward the periphery thereof. Furthermore, the scan speed is lowered toward the peripheral part where the area of the wafer W increases. Therefore, the wafer W can be sufficiently dried without the formation of water marks on the front surface of the wafer W.

Incidentally, for measures against static electricity in the step of drying, as described above, ions are caused to be contained in a drying aid gas by an ionizer and static electricity generated is discharged into the air. Also, the rotational speed and time of the spin chuck 1 and the injection volume of nitrogen gas are appropriately changed depending on the diameter of the wafer W.

As described above, with a spin cleaning and drying apparatus and a spin cleaning and drying method according to the present invention, the wafer W can be sufficiently dried without the formation of water marks on the front surface of the wafer W after its cleaning with pure water.

What is claimed is:

1. A spin cleaning and drying apparatus of single-wafer processing type which cleans a substrate by supplying a cleaning liquid from a rinse nozzle while rotating the substrate and dries the substrate after cleaning while rotating the substrate, comprising:
    means for providing a supply of cleaning liquid;
    means for providing a supply of drying aid gas;
    a spin chuck which holds and rotates the substrates;
    a cup enclosing the spin chuck which has an opening on an upper side thereof, and has a cleaning liquid discharge port and an exhaust gas port in a bottom portion thereof;
    a flow regulating plate which has a gas injection port in a middle portion thereof and is provided so as to be able to move backward and forward to a position opposed to the substrate held by the spin chuck and spaced therefrom at a prescribed distance and to an upward or sideward retracted position, the gas injection port being connected to said means for providing a supply of drying aid gas; and
    an exhaust cover positioned beneath the spin chuck and above the exhaust gas port, said exhaust cover having multiple radially extending slit holes, with each of the slit holes being shielded from above by a hood which overhangs the slit hole and projects from an upper surface of the exhaust cover in a circumferential direction of the exhaust cover forming an intake opening below the spin chuck and above the exhaust gas port.

2. The spin cleaning and drying apparatus according to claim 1, wherein the flow regulating plate is formed from an electrically conductive material.

3. A spin cleaning and drying apparatus of single-wafer processing type which cleans a substrate by supplying a cleaning liquid from a rinse nozzle while rotating the substrate and dries the substrate after cleaning while rotating the substrate, comprising:
    means for providing a supply of cleaning liquid;
    means for providing a supply of drying aid gas;
    a spin chuck which holds and rotates the substrates;
    a cup which has an opening on an upper side thereof, is provided with a cleaning liquid discharge port and an exhaust gas port in a bottom portion thereof, and encloses the spin chuck;
    a scan arm which has a gas injection port at a leading end thereof and traverses the substrate from a center part to a peripheral part thereof, and
    an exhaust cover positioned beneath the spin chuck and above the exhaust gas port, said exhaust cover having multiple radially extending slit holes, with each of the slit holes being shielded from above by a hood which overhangs the slit hole and projects from an upper surface of the exhaust cover in a circumferential direction of the exhaust cover forming an intake opening below the spin chuck and above the exhaust gas port.

4. The spin cleaning and drying apparatus according to claim 1, wherein the slit holes with hood are formed from the middle portion of the exhaust cover to a peripheral part thereof and wherein each of the hoods is formed so as to extend from a first long side of the respective slit hole to an opposite second long side thereof and wherein the intake opening is at said second long side.

5. The spin cleaning and drying apparatus according to claim 2, wherein the slit holes with hood are formed from the middle part of the exhaust cover to the peripheral part thereof and wherein the hood is formed from one side of a long side of the slit hole to the other side thereof and opens on the other side.

6. The spin cleaning and drying apparatus according to claim 3, wherein the slit holes with hood are formed from the middle part of the exhaust cover to the peripheral part thereof and wherein the hood is formed from one side of a long side of the slit hole to the other side thereof and opens on the other side.

* * * * *